(12) United States Patent
Chui

(10) Patent No.: US 9,570,828 B2
(45) Date of Patent: Feb. 14, 2017

(54) COMPRESSIBLE PIN ASSEMBLY HAVING FRICTIONLESSLY CONNECTED CONTACT ELEMENTS

(71) Applicant: Corad Technology Inc., Santa Clara, CA (US)

(72) Inventor: Ka Ng Chui, Menlo Park, CA (US)

(73) Assignee: Corad Technology Inc., Santa Clara, CA (US)

( * ) Notice: Subject to any disclaimer, the term of this patent is extended or adjusted under 35 U.S.C. 154(b) by 95 days.

(21) Appl. No.: 14/216,103

(22) Filed: Mar. 17, 2014

(65) Prior Publication Data

US 2014/0199895 A1    Jul. 17, 2014

Related U.S. Application Data

(63) Continuation-in-part of application No. 13/644,125, filed on Oct. 3, 2012, now abandoned.

(51) Int. Cl.

| H01R 12/00 | (2006.01) |
|---|---|
| H01R 13/17 | (2006.01) |
| G01R 1/067 | (2006.01) |
| H01R 13/24 | (2006.01) |
| H01R 12/71 | (2011.01) |

(52) U.S. Cl.
CPC .......... *H01R 13/17* (2013.01); *G01R 1/06722* (2013.01); *H01R 13/2414* (2013.01); *H01R 13/2421* (2013.01); *H01R 12/714* (2013.01); *H01R 2201/20* (2013.01)

(58) Field of Classification Search
CPC . H01R 23/722; H01R 23/725; H01R 13/2421; H05K 7/1084; H05K 7/1023; H05K 3/368; G03B 17/02; G01R 1/07314; G01R 1/0483

USPC . 439/66, 70–75, 515, 700, 824; 324/754.13, 754.14, 756.02
See application file for complete search history.

(56) References Cited

U.S. PATENT DOCUMENTS

| 4,743,201 A | | 5/1988 | Robinson et al. | |
|---|---|---|---|---|
| 5,061,192 A | * | 10/1991 | Chapin .............. | H01R 13/2414 439/591 |
| 5,163,834 A | * | 11/1992 | Chapin .............. | H01R 13/2435 439/591 |

(Continued)

OTHER PUBLICATIONS

Non-Final Office Action for U.S. Appl. No. 13/644,125, mailed Jan. 3, 2014.

(Continued)

*Primary Examiner* — Thanh Tam Le
(74) *Attorney, Agent, or Firm* — Paradice and Li LLP

(57) ABSTRACT

A compressible contact pin. The contact pin includes a first contact element and a second contact element. A compressible member is coupled between the first contact element and the second contact element to compress when one or more external forces are applied between the first contact element and the second contact element. In addition, the compressible member maintains a separation distance between the first and second contact elements when no external forces are applied. An elastomeric connector is coupled between the first contact element and the second contact element. The elastomeric connector electrically couples the first contact element to the second contact element by deforming when the one or more external forces are applied between the first contact element and the second contact element.

9 Claims, 8 Drawing Sheets

(56) References Cited

U.S. PATENT DOCUMENTS

| | | | |
|---|---|---|---|
| 5,321,224 A * | 6/1994 | Kamimura | B23K 9/04 |
| | | | 219/137 R |
| 5,385,477 A | 1/1995 | Vaynkof et al. | |
| 6,033,233 A | 3/2000 | Haseyama et al. | |
| 6,264,476 B1 | 7/2001 | Li et al. | |
| 6,403,226 B1 * | 6/2002 | Biernath | H01R 13/2414 |
| | | | 428/209 |
| 6,712,620 B1 | 3/2004 | Li et al. | |
| 6,773,312 B2 * | 8/2004 | Bauer | H01R 13/2421 |
| | | | 439/816 |
| 6,921,299 B2 * | 7/2005 | McMaster | H01R 9/05 |
| | | | 439/320 |
| 6,958,616 B1 * | 10/2005 | Mahoney | G01R 1/06722 |
| | | | 324/755.05 |
| 7,308,738 B2 * | 12/2007 | Barvosa-Carter | A44B 18/0007 |
| | | | 24/442 |
| 7,377,822 B1 | 5/2008 | Shen | |
| 7,666,000 B1 | 2/2010 | Hsiao et al. | |
| 7,833,020 B1 | 11/2010 | Ma et al. | |
| 8,029,291 B2 | 10/2011 | Park | |
| 8,084,927 B2 * | 12/2011 | Xiao | H01J 1/13 |
| | | | 313/310 |
| 8,102,184 B2 | 1/2012 | Sherry et al. | |
| 8,118,604 B2 | 2/2012 | Ma | |
| 8,659,312 B2 * | 2/2014 | Nakata | G01R 1/07 |
| | | | 324/750.17 |

OTHER PUBLICATIONS

Final Office Action for U.S. Appl. No. 13/644,125, mailed Mar. 20, 2014.

* cited by examiner

COMPRESSIBLE PIN ASSEMBLY HAVING FRICTIONLESSLY CONNECTED CONTACT ELEMENTS

RELATED APPLICATIONS

This application is a continuation-in-part of U.S. patent application Ser. No. 13/644,125, entitled "COMPRESSIBLE PIN ASSEMBLY HAVING FRICTIONLESSLY CONNECTED CONTACT ELEMENTS," filed on Oct. 3, 2012; the aforementioned priority application being hereby incorporated by reference in its entirety.

TECHNICAL FIELD

The present invention relates generally to compressible contact pins used in the testing of electronic devices, and specifically to a compressible pin assembly having frictionlessly connected contact elements.

BACKGROUND OF RELATED ART

Pogo pins are often used in the testing of integrated circuit (IC) devices. IC packages typically have a number of contact pads, which serve as an interface or connection point to external circuitry. These contact pads are very small and delicate. Thus, a testing apparatus, used to test the function or performance of an IC device, must be able to make contact with one or more contact pads on the IC device without damaging the pads. Otherwise, the device may be rendered unusable for its intended purpose. The design and compressibility of pogo pins allow them to make contact with an IC device or a contact pad on the device.

FIG. 1 illustrates a prior art embodiment of a typical pogo pin. The pogo pin 100 is made up of two contact elements 110 and 120, held together by a spring 130 and a housing 140. The first contact element 110 is designed to make a secure contact with a contact pad of an IC device. The second contact element 120 can be connected to circuitry on a testing apparatus. The first and second contact elements 110 and 120 are electrically coupled together via the housing 140 to bridge a connection between the ends of the pogo pin 100 so that electrical signals can be transmitted between the testing apparatus and the IC device.

When the pogo pin 100 is sandwiched between an IC device and a testing apparatus, the spring 130 compresses to exert force on the contact pad of the IC device by the first contact element 110. However, in order to maintain an electrical connection between the IC device and the testing apparatus, the first and second contact elements 110 and 120 must remain in constant contact with the housing 140, regardless of the amount of compression or displacement caused by the force of contact with the underlying IC device. Accordingly, the first and second contact elements 110 and 120 must rub against the inner wall of the housing 140, creating contact resistance, as the pogo pin 100 is compressed and decompressed. The friction between the first and second contact elements 110 and 120 and the housing 140 causes wear and tear on the surfaces 150 where each of the first and second contact elements 110 and 120 makes contact with the housing 140. This, in turn, increases the contact resistance. Such wear and tear, along with the increased contact resistance, can reduce the signal quality transmitted by the pogo pin 100 over time.

Accordingly, there is a need for a compressible contact pin that can withstand continued use without loss of signal quality. More specifically, there is a need for a compressible contact pin comprised of frictionlessly connected contact elements, so that the contact pin can be compressed and decompressed without substantial wear and tear on its parts and/or increased contact resistance.

BRIEF DESCRIPTION OF THE DRAWINGS

The present embodiments are illustrated by way of example and not intended to be limited by the figures of the accompanying drawings, where.

DETAILED DESCRIPTION

A compressible contact pin having frictionlessly connected contact elements is disclosed. In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements may be shown as buses or as single signal lines. Each of the buses may alternatively be a single signal line, and each of the single signal lines may alternatively be a bus. As used herein, references to "frictionless" or "frictionlessly" may refer to an absence of surface-to-surface contact or rubbing when two or more components are moveably coupled to one another. Furthermore, the terms "contact pad" and "contact bump" may be used herein interchangeably. Accordingly, the present invention is not to be construed as limited to specific examples described herein but rather includes within its scope all embodiments defined by the appended claims.

Present embodiments provide a compressible contact pin having no contact force on the moving parts along its signal path. The contact elements of the compressible contact pin are frictionlessly coupled together so that the surfaces of the contact elements do not rub against or make contact with any other surfaces of the compressible contact pin as the pin is compressed and decompressed. In specific embodiments, a compressible contact pin includes two contact elements connected via a deformable conductor that flexes or bends when the contact pin is compressed. Other embodiments provide for a contact pin assembly, wherein a compressible contact pin is disposed in a housing that provides structural support for the contact pin and prevents lateral movement of the contact elements.

Figure 1:
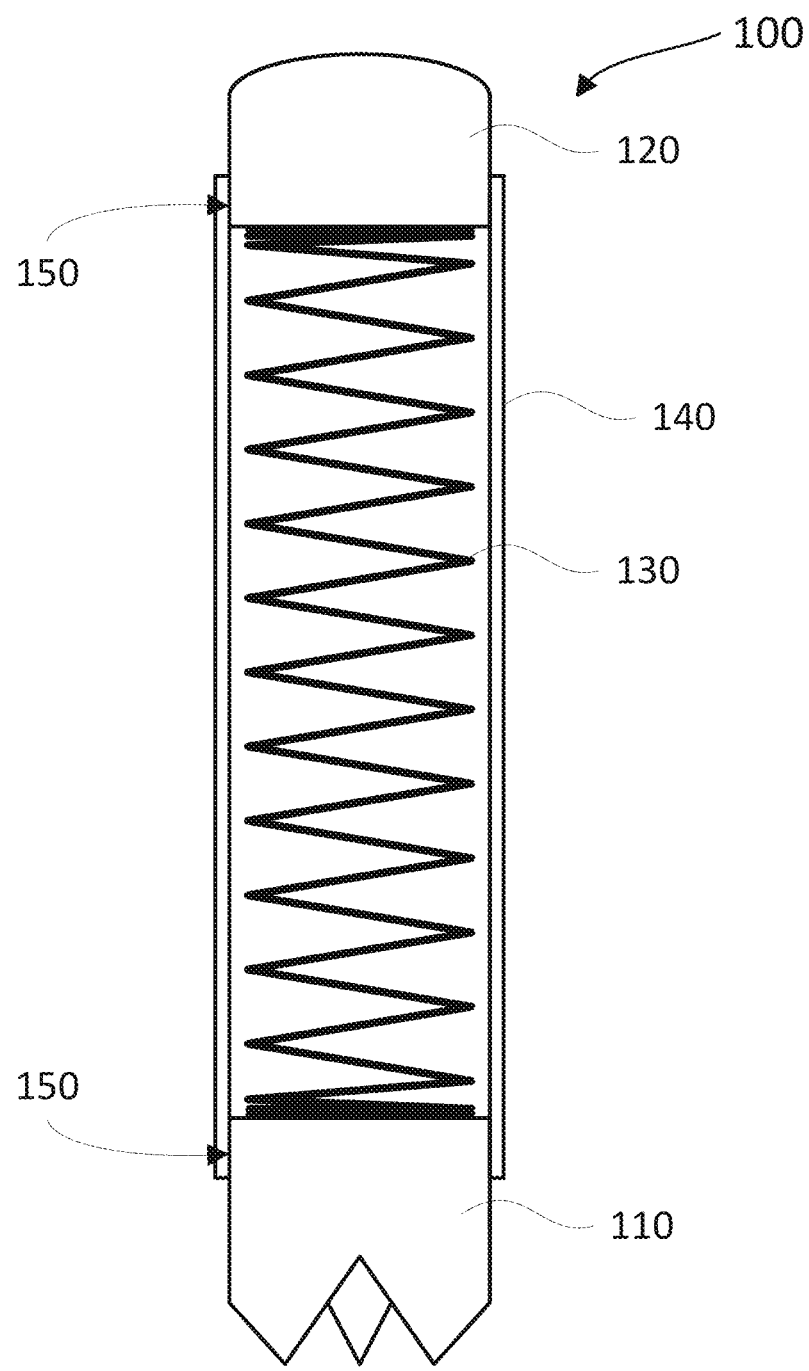
FIG. 1 illustrates a prior art embodiment of a pogo pin.
Figure 2:
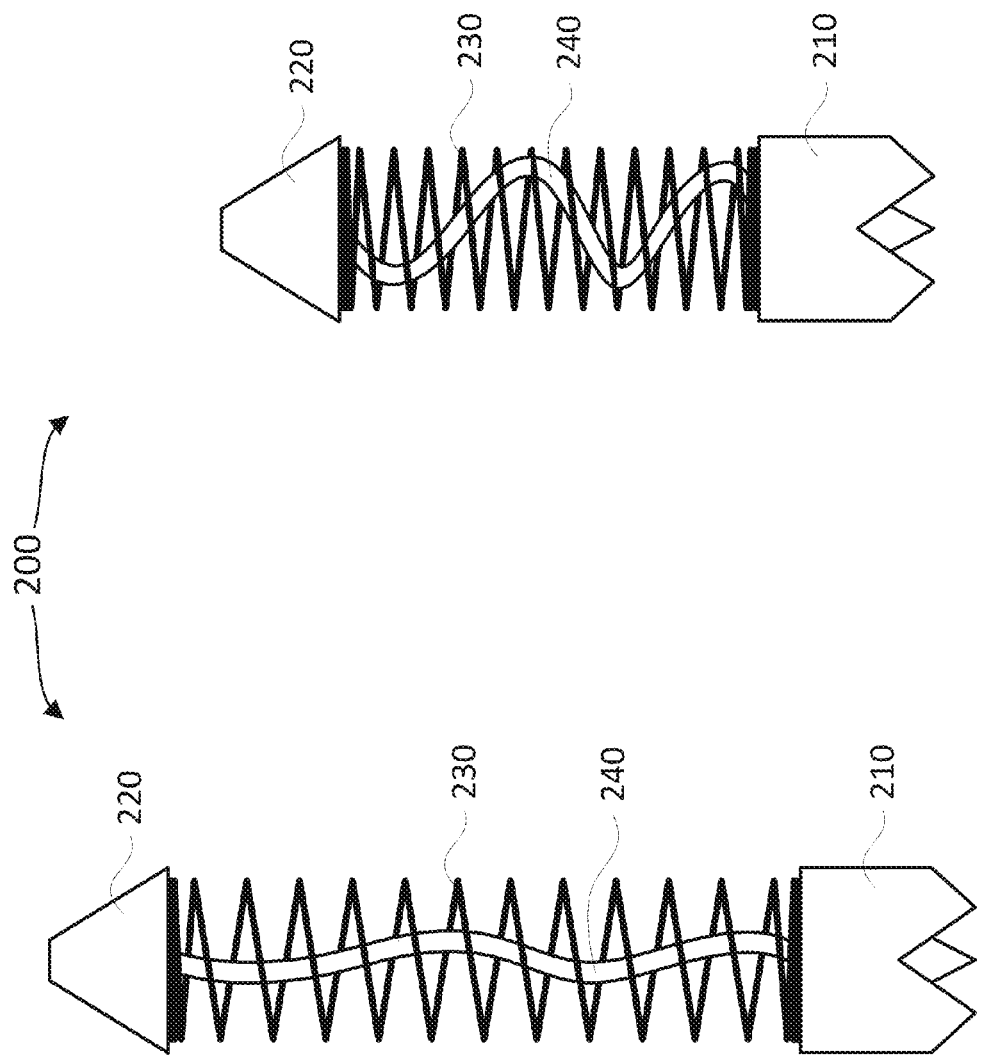
FIGS. 2A & 2B illustrate an embodiment of a compressible contact pin having frictionlessly connected contact elements.

FIGS. 2A & 2B illustrate an embodiment of a compressible contact pin having frictionlessly connected contact elements. The compressible contact pin 200 includes a first contact element 210, a second contact element 220, a compressible member 230, and a deformable conductor 240. In some embodiments, the shape or geometry of the first contact element 210 is designed to allow the first contact element 210 to make contact with a contact pad (or contact "bump") of an IC device. Similarly, the shape of the second contact element 220 may be designed to allow the second contact element 220 to make contact with the circuitry of a testing apparatus.

The compressible member 230 maintains a separation distance between the first and second contact elements 210 and 220, thus extending the "reach" of the contact pin 200 when the contact pin 200 is in a "natural" or uncompressed state. In addition, the compressible member 230 absorbs some of the force exerted by one or more of the contact elements 210 and 220 when making contact with an IC device or testing apparatus. For example, when the first contact element 210 is brought into contact with a contact pad of an IC device or package, the compressible member 230 compresses to allow an inward travel of the first contact element 210, as shown in FIG. 2B. This causes the first contact element 210 to exert a force on the contact pad of an underlying IC device in order to form a robust contact and/or connection with the contact pad. When the first contact element 210 is no longer pressed against the contact pad of an IC device, the compressible member 230 reverts back to its natural, uncompressed state.

The deformable conductor 240 electrically couples the first contact element 210 with the second contact element 220 to facilitate a flow of electrical signals (or current) between the first and second contact elements 210 and 220. As shown in FIG. 2B, the deformable conductor 240 "deforms" (e.g., flexes or bends) when the contact pin 200 is compressed. This allows the first contact element 210 to remain electrically coupled to the second contact element 220 regardless of the degree of compression of the contact pin 200. Moreover, compression of the contact pin 200 does not create any friction among the contact elements 210 and 220 or deformable conductor 240 because no surfaces of the first and second contact element 210 and 220, or deformable conductor 240, rub against any other surfaces of the compressible contact pin 200.

In some embodiments, the compressible member 230 may be a spring or spring-like structure that compresses under external forces or pressure, but naturally reverts to an uncompressed state when no external force is applied. Furthermore, the compressible member 230 may be formed from (or coated with) a non-conductive material that does not interfere with a flow of electrical signals between the first and second contact elements 210 and 220. In other embodiments, the compressible member 230 simply has a higher electrical impedance than that of the deformable conductor 240 to ensure that electrical signals communicated between the first and second contact elements 210 and 220 travel only along the deformable conductor 240. The compressible member 230 may be attached to the first and second contact elements 210 and 220 using any number of processes that are well known in the art. For example, each of the contact elements 210 and 220 may be attached to a different end of the compressible member 230 using an adhesive material (e.g., glue). Alternatively, the ends of the compressible member 230 may be welded or soldered to each of the first and second contact elements 210 and 220.

In some embodiments, the deformable conductor 240 may be structurally configured to deform when an external force is applied. Alternatively, the deformable conductor 240 may be of a conductive material that naturally deforms when compressed, such as a copper wire. The deformable conductor 240 may be separately attached to the first and second contact elements 210 and 220 using any number of processes that are well known in the art. For example, the ends of the deformable conductor 240 may be welded or soldered to the first and second contact elements 210 and 220, respectively (e.g., using laser welding and/or soldering techniques).

The frictionless coupling of the first and second contact elements 210 and 220 is advantageous because it reduces the wear and tear along the signal path of the compressible contact pin 200, thus preserving the signal integrity of electrical signals transmitted via the contact pin 200 after repeated uses. This, in turn, prolongs the usable life of the compressible contact pin 200.

Figure 3:
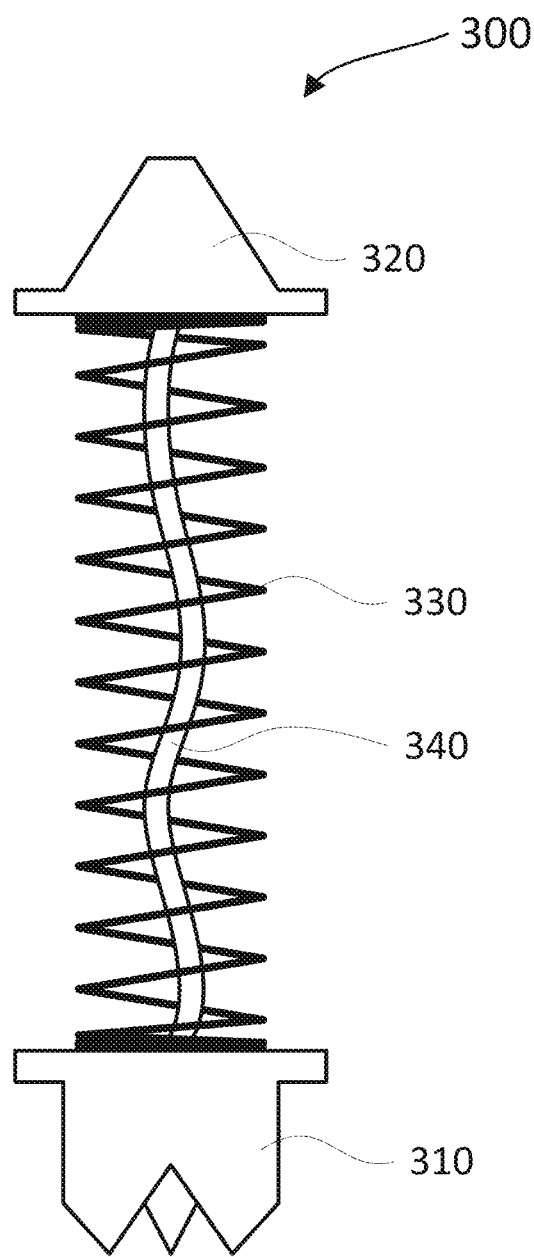
FIG. 3 illustrates another embodiment of a compressible contact pin having frictionlessly connected contact elements.

FIG. 3 illustrates another embodiment of a compressible contact pin having frictionlessly connected contact elements. The compressible contact pin 300 includes a first contact element 310, a second contact element 320, a compressible member 330, and a deformable conductor 340. The first and second contact elements 310 and 320 are mechanically coupled via the compressible member 330, which maintains a distance of separation between the first and second contact elements 310 and 320 when the contact pin 300 is in an uncompressed state. The deformable conductor 340 electrically couples the first contact element 310 with the second contact element 320 to facilitate a flow of electrical signals between the first and second contact elements 310 and 320.

The shape of the first contact element 310 may be designed to allow the first contact element 310 to make contact with a contact pad of an IC device. In an embodiment, the base of the first contact element 310 (e.g., where the deformable conductor 340 attaches) has an extended lip that may be used to hold the contact pin 300 within a housing or support structure, as will be discussed in greater detail with respect to FIGS. 4A & 4B. In addition, the extended lip may reduce the overall wear and tear on the first contact element 310 as it moves within the housing. The shape of the second contact element 320 may be designed to allow the second contact element 320 to make contact with the circuitry of a testing apparatus. According to an embodiment, the base of the second contact element 320 also has an extended lip that may be used to hold the contact pin 300 within a housing and/or reduce wear and tear while moving within the housing.

Figure 4A:
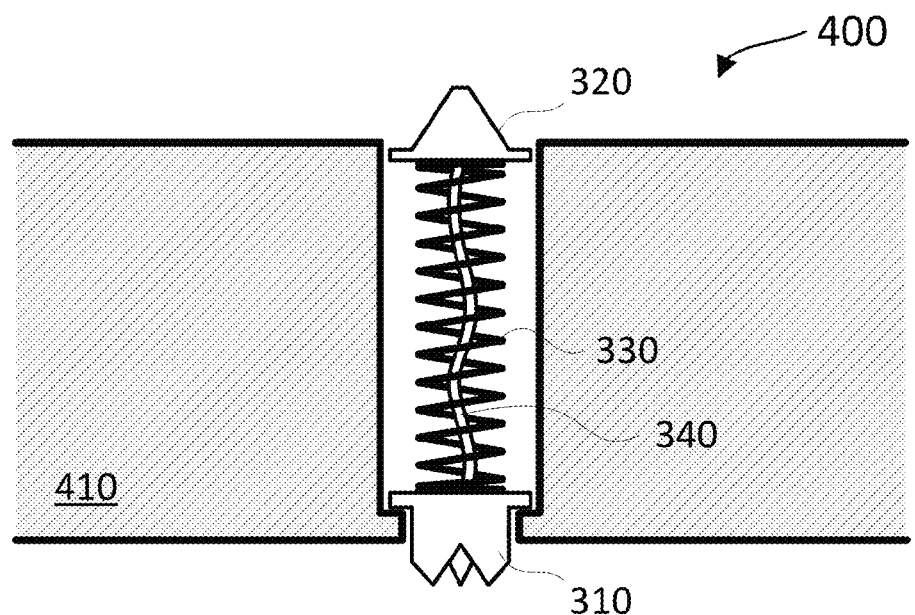
FIGS. 4A & 4B illustrate an embodiment of a compressible contact pin assembly.

FIG. 4A illustrates an embodiment of a compressible contact pin assembly. The contact pin assembly 400 includes a first contact element 310, a second contact element 320, a compressible member 330, a deformable conductor 340, and a housing 410. The first and second contact elements 310 and 320, compressible member 330, and deformable conductor 340 collectively form the compressible contact pin 300 shown in FIG. 3. The housing 410 holds the contact pin 300 in place when interfacing a testing apparatus with an IC device. For example, the bottom surface of the housing 410 may have a opening that is not wide enough for the base of the first contact element 310 to fit through. In addition, the housing 410 provides structural support for the compressible contact pin 300 by guiding the movement or displacement of the first and second contact elements 310 and 320.

Figure 4B:
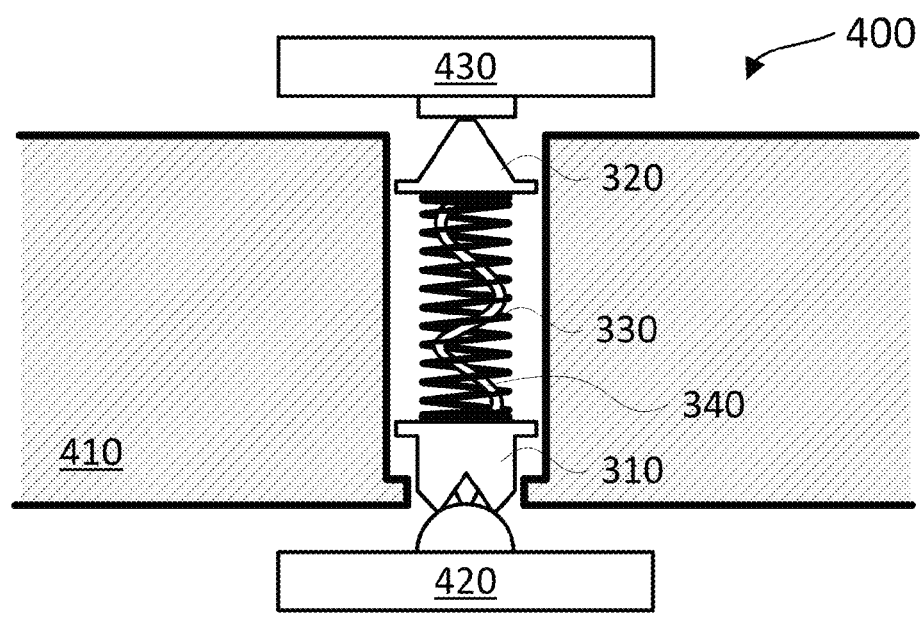

FIG. 4B shows the contact pin assembly of FIG. 4A with the compressible contact pin 300 in a compressed state. As shown in FIG. 4B, the second contact element 320 makes contact with a testing apparatus 430, and the first contact element 310 is brought into contact with a contact bump of an IC device 420. This causes the compressible member 330 to compress, thus causing the first contact element 310 to exert a force on the contact bump of the IC device 420. The deformable conductor 340 also deforms (e.g., flexes or bends) when the compressible member 330 compresses. Accordingly, the deformable conductor 340 maintains an electrical connection between the first contact element 310 and the second contact element 320 without causing any surfaces of the first and second contact elements 310 and 320, or deformable conductor 340, to rub against any other surfaces of the compressible contact pin 300. The deformable conductor 340 thus facilitates the transmission of electrical signals between the testing apparatus 430 and the IC device 420 without substantial wear or tear.

In some embodiments, the compressible member 330 may be a spring or spring-like structure that compresses under external forces or pressure, but naturally reverts to an uncompressed state when no external force is applied. Furthermore, the compressible member 330 may be formed from a non-conductive material. Alternatively, the compressible member 330 may have a higher electrical impedance than that of the deformable conductor 340. The compressible member 330 may be attached to the first and second contact elements 310 and 320 using any number of processes that are well known in the art. For example, each of the contact elements 310 and 320 may be attached to a different end of the compressible member 330 using an adhesive material (e.g., glue). Alternatively, the ends of the compressible member 330 may be welded or soldered to the first and second contact elements 310 and 320.

In some embodiments, the deformable conductor 340 may be structurally configured to deform when an external force is applied. Alternatively, the deformable conductor 340 may be of a conductive material that naturally deforms when compressed, such as copper wire. The deformable conductor 340 may be separately attached to the first and second contact elements 310 and 320 using any number of processes that are well known in the art. For example, the ends of the deformable conductor 340 may be welded or soldered to the first and second contact elements 310 and 320.

In some embodiments, the housing 410 may be formed from a non-conductive/dielectric material. Furthermore, the housing 410 may be configured to hold multiple compressible contact pins similar to the compressible contact pin 300 shown in FIG. 3. For example, the contact pin assembly 400 may correspond to the probe head associated with a probe card.

The frictionless coupling of the first and second contact elements 310 and 320 is advantageous because it reduces the wear and tear along the signal path of the compressible contact pin 300, thus preserving the signal integrity of electrical signals transmitted via the contact pin 300 after repeated uses. In addition, the housing 410 maintains the structural rigidity of the contact pin assembly 400 while also restricting lateral movement and/or displacement of the first and second contact elements 310 and 320 when making contact with the IC device and testing apparatus, respectively.

Figure 5A:
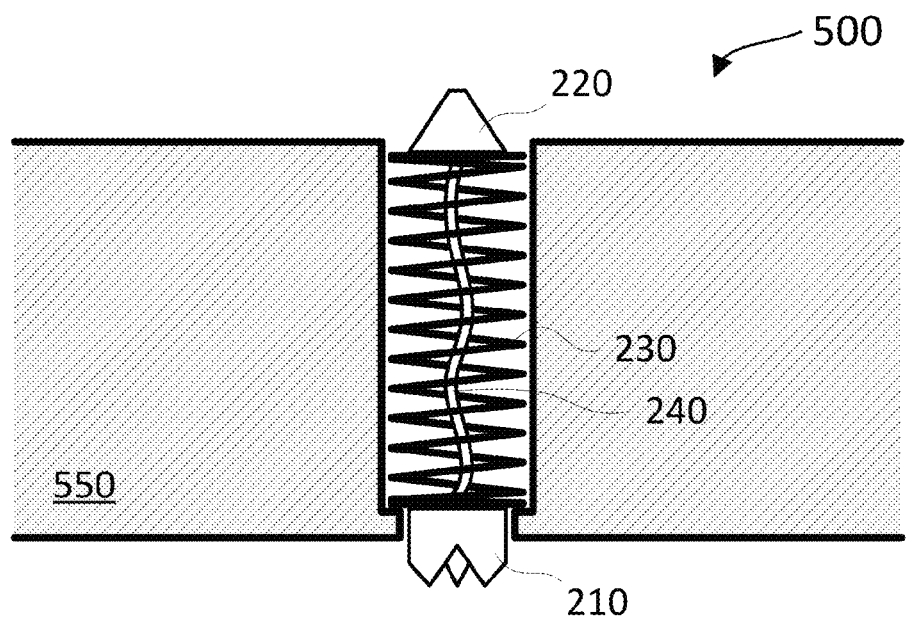
FIGS. 5A & 5B illustrate another embodiment of a compressible contact pin assembly.

FIG. 5A illustrates another embodiment of a compressible contact pin assembly. The contact pin assembly 500 includes a first contact element 210, a second contact element 220, a compressible member 230, a deformable conductor 240, and a housing 550. The first and second contact elements 210 and 220, compressible member 230, and deformable conductor 240 collectively form the compressible contact pin 200 described above with respect to FIGS. 2A & 2B. However, in this embodiment, the compressible member 230 has a wider diameter relative to the diameter of the contact elements 210 and 220. The housing 550 holds the contact pin 200 in place when interfacing a testing apparatus with an IC device. For example, the bottom surface of the housing 550 may have an opening that is not wide enough for the compressible member 230 to fit through. In addition, the housing 550 provides structural support for the compressible contact pin 200 by guiding the movement or displacement of the first and second contact elements 210 and 220.

Figure 5B:
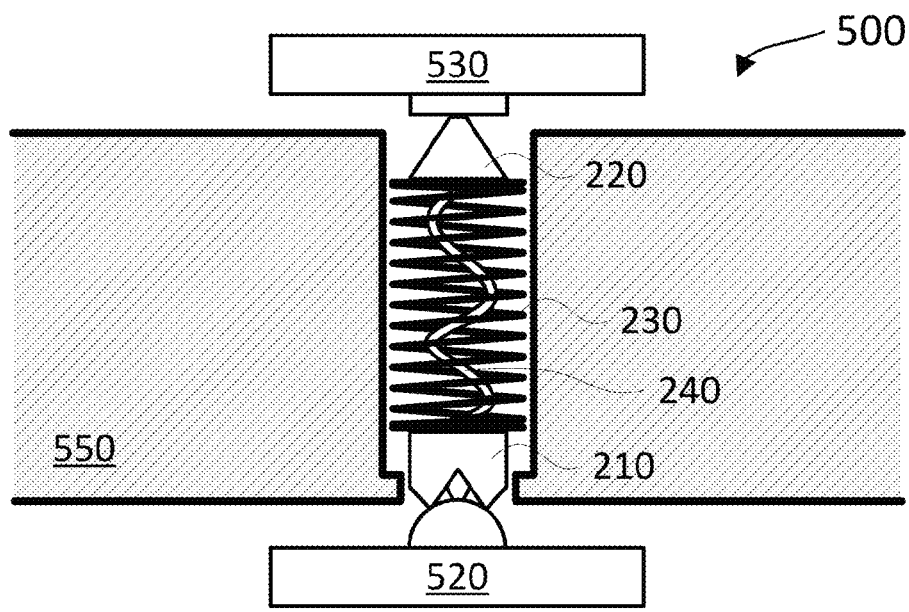

FIG. 5B shows the contact pin assembly of FIG. 5A with compressible contact pin 200 in a compressed state. As shown in FIG. 5B, the second contact element 220 makes contact with a testing apparatus 530, and the first contact element 210 is brought into contact with a contact bump of an IC device 520. This causes the compressible member 230 to compress, thus causing the first contact element 210 to exert a force on the contact bump of the IC device 520. The deformable conductor 240 also deforms (e.g., flexes or bends) when the compressible member 230 compresses. Accordingly, the deformable conductor 240 maintains an electrical connection between the first contact element 210 and the second contact element 220 without causing any surfaces of the first and second contact elements 210 and 220, or deformable conductor 240, to rub against any other surfaces of the compressible contact pin 200.

In some embodiments, the compressible member 230 may be a spring or spring-like structure that compresses under external forces or pressure, but naturally reverts to an uncompressed state when no external force is applied. Furthermore, the compressible member 230 may be formed from a non-conductive material. Alternatively, the compressible member 230 may have a higher electrical impedance than that of the deformable conductor 240. The compressible member 230 may be attached to the first and second contact elements 210 and 220 using any number of processes that are well known in the art. For example, each of the contact elements 210 and 220 may be attached to a different end of the compressible member 230 using an adhesive material. Alternatively, the ends of the compressible member 230 may be welded or soldered to the first and second contact elements 210 and 220.

In some embodiments, the deformable conductor 240 may be structurally configured to deform when an external force is applied. Alternatively, the deformable conductor 240 may be of a conductive material that naturally deforms when compressed, such as copper wire. The deformable conductor 240 may be separately attached to the first and second contact elements 210 and 220 using any number of processes that are well known in the art. For example, the ends of the deformable conductor 240 may be welded or soldered to the first and second contact elements 210 and 220. In some embodiments, the housing 550 may be formed from a non-conductive/dielectric material. Furthermore, the housing 550 may be configured to hold multiple compressible contact pins.

Figure 6:
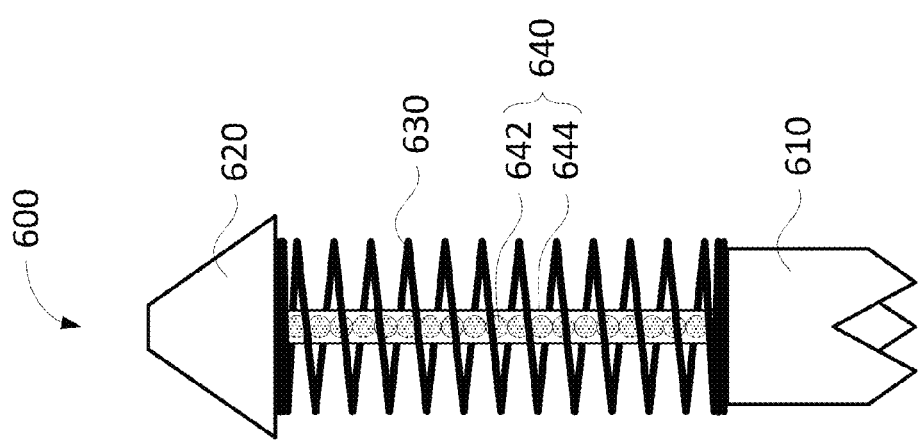

FIG. 6 illustrates an embodiment of a compressible contact pin assembly 600 having an elastomeric connector. The compressible contact pin 600 includes a first contact element 610, a second contact element 620, a compressible member 630, and a deformable conductor 640. As described above, the shape or geometry of the first contact element 610 may be designed to allow the first contact element 610 to make contact with a contact pad or bump of an IC device. Further, the shape of the second contact element 620 may be designed to allow the second contact element 620 to make contact with the circuitry of a testing apparatus. For some embodiments, the base diameter of the second contact element 620 is wider than the diameter of the compressible member 630, and thus at least a portion of the second contact element 620 extends beyond the outer circumference of the compressible member 630 (e.g., to hold the contact pin 600 within a housing or support structure). Further, it should be noted that the base diameter of the first contact element 610 may be of equal or smaller size than the diameter of the compressible member 630.

The compressible member 630 maintains a separation distance between the first and second contact elements 610 and 620 when the contact pin 600 is in a natural or uncompressed state. When placed in contact with an IC device and/or testing apparatus, the compressible member 630 absorbs some of the force exerted on one or more of the contact elements 610 and 620. For some embodiments, the compressible member 630 may be a spring or spring-like structure that compresses under external forces or pressure, but naturally reverts to an uncompressed state when no external force is applied. Further, for some embodiments, the compressible member 630 may be formed from (or coated with) a non-conductive material that does not interfere with a flow of electrical signals between the first and second contact elements 610 and 620. In other embodiments, the compressible member 630 may have a higher electrical impedance than that of the deformable conductor 640 to ensure that electrical signals communicated between the first and second contact elements 610 and 620 travel only via the deformable conductor 640. The compressible member 630 may be attached to each of the contact elements 610 and 620 using an adhesive material (e.g., glue). Alternatively, the ends of the compressible member 630 may be welded or soldered to each of the first and second contact elements 610 and 620.

The deformable conductor 640 electrically couples the first contact element 610 with the second contact element 620 to facilitate a flow of electrical signals (or current) between the first and second contact elements 610 and 620. For some embodiments, the deformable conductor 640 is an elastomeric connector. The elastomeric connector includes column of conductive particles 642 (such as silver-plated nickel) disposed within an elastic (e.g., silicon) shield 644. The conductive particles 642 are in contact with one another to form a column of conductive material bridging the first contact element 610 with the second contact element 620. The elastic shield 644 "deforms" (e.g., stretches laterally) when the contact pin 600 is compressed, allowing the conductive particles 642 to press against and/or compress with one another and thus maintain an electrical connection between the first contact element 610 and the second contact element 620 while the pin 600 is under compression. It should be noted that, compression of the contact pin 600 does not create any friction among the contact elements 610 and 620 or deformable conductor 640 because no surfaces of the first and second contact element 610 and 620, or deformable conductor 640, rub against any other surfaces of the compressible contact pin 600.

The deformable conductor 640 may be attached to the first and second contact elements 610 and 620 using any number of processes that are well known in the art. For example, the ends of the elastic shield 644 may be attached to the first and second contact elements 610 and 620, respectively, using an adhesive material (e.g., glue). For some embodiments, the deformable conductor 640 may be held in place by forces exerted between the first and second contact elements 610 and 620. For example, the forces holding the deformable conductor 640 in place may be provided by the tension in the compressible member 630 (e.g., in the compressed and/or uncompressed state).

Figure 7:
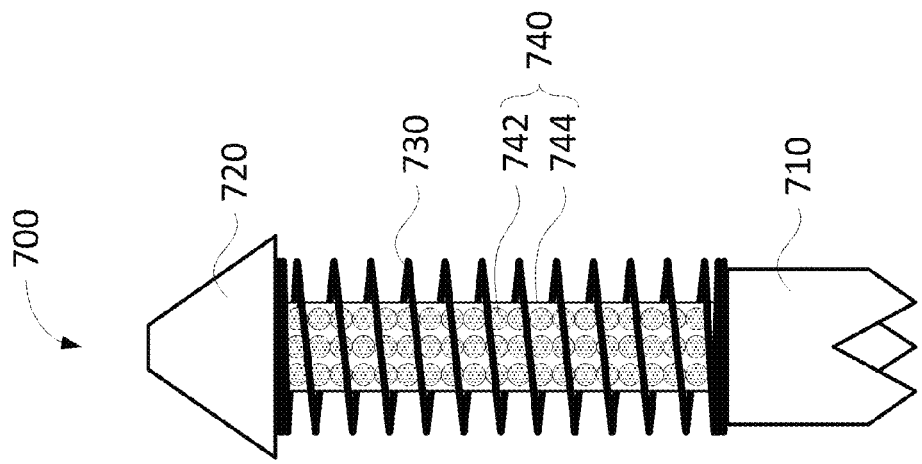
FIGS. 6-8 illustrate embodiments of a compressible contact pin assembly having an elastomeric connector.

FIG. 7 illustrates another embodiment of a compressible contact pin assembly 700 having an elastomeric connector. The compressible contact pin 700 includes a first contact element 710, a second contact element 720, a compressible member 730, and a deformable conductor 740. The first and second contact elements 710 and 720 may have the same or substantially similar features as the first and second contact elements 610 and 620, respectively, as described above with respect to FIG. 6. Furthermore, the compressible member 730 may perform the same or substantially similar function as the compressible member 630, also described above with respect to FIG. 6.

The deformable conductor 740 is an elastomeric connector that electrically couples the first contact element 710 with the second contact element 720. In contrast with the deformable conductor 640 of FIG. 6, which includes a single column of conductive particles 642, the deformable conductor 740 includes multiple columns of conductive particles 742 disposed within an elastic shield 744. The elastic shield 744 deforms when the contact pin 700 is compressed, allowing the conductive particles 742 in each column to press against and/or compress with one another. Accordingly, each column of conductive particles 742 maintains a corresponding electrical connection between the first contact element 710 and the second contact element 720 while the pin 700 is compressed. It should be noted that, by having multiple columns of conductive particles 742, multiple current paths are established between the first contact element 710 and the second contact element, thereby increasing the current-carrying capacity of the deformable conductor 740.

As described above, the deformable conductor 740 may be attached to the first and second contact elements 710 and 720 using any number of processes that are well known in the art. For example, the ends of the elastic shield 744 may be attached to the first and second contact elements 710 and 720, respectively, using an adhesive material. For some embodiments, the deformable conductor 740 may be held in place by forces exerted between the first and second contact elements 710 and 720. For example, the forces holding the deformable conductor 740 in place may be provided by the tension in the compressible member 730 (e.g., in the compressed and/or uncompressed state).

Figure 8:
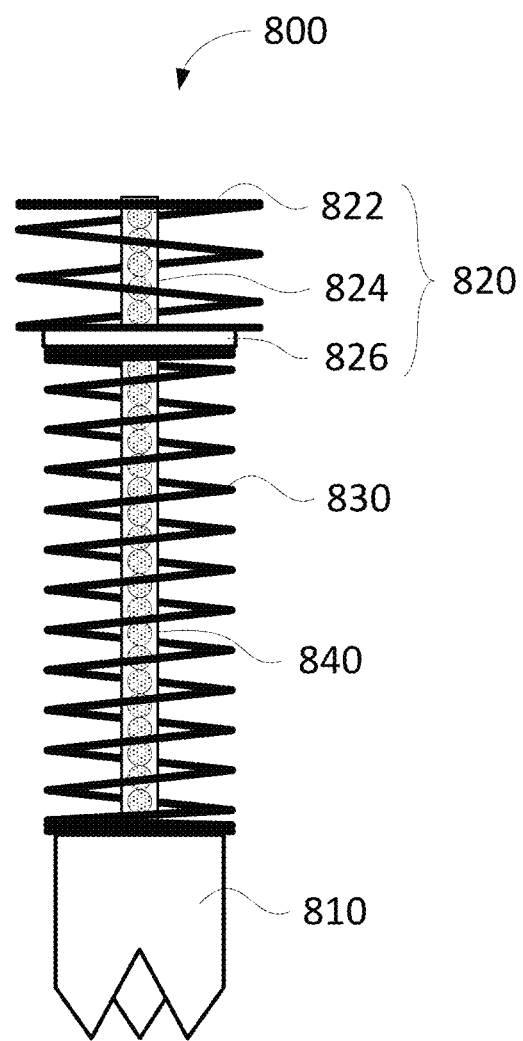

FIG. 8 illustrates yet another embodiment of a compressible contact pin assembly 800 having an elastomeric connector. The compressible contact pin 800 includes a first contact element 810, a second contact element 820, a first compressible member 830, and a first deformable conductor 840. The first contact element 810 and the first compressible member 830 may perform the same or substantially similar function as the first contact element 610 and compressible member 630, respectively, described above with respect to FIG. 6.

For some embodiments, the first deformable conductor 840 may have the same or substantially similar features as the deformable conductor 640 or deformable conductor 740, described above with respect to FIGS. 6 and 7, respectively. That is, the first deformable conductor 840 may be an elastomeric connector, having one or more columns of conductive material, which electrically couples the first contact element 810 with the second contact element 820. For other embodiments, the first deformable conductor 840 may correspond to any conductive structure that is able maintain an electrical connection between the first contact element 810 and the second contact element 820 while under compression (such as a conductive wire).

As described above, the first deformable conductor 840 may be attached to the first and second contact elements 810 and 820 using any number of processes that are well known in the art. For example, the ends of the first deformable conductor 840 may be attached to the first and second contact elements 810 and 820, respectively, using an adhesive material. For some embodiments, the first deformable conductor 840 may be held in place by forces exerted between the first and second contact elements 810 and 820. For example, the forces holding the deformable conductor 840 in place may be provided by the tension in the first compressible member 830.

The second contact element 820 includes a second compressible member 822, a second deformable conductor 824, and a conductive plate 826. The conductive plate 826 attaches to the end of the first compressible member 830, and the second compressible member 822 and second deformable conductor 824 are attached to the other side of the conducive plate 826. More specifically, the conductive plate 826 may be of a conductive material (e.g., metal) to provide an electrical coupling between the first deformable conductor 840 and the second deformable conductor 824. For other embodiments, a diameter of the second compressible member 822 may be wider than the overall diameter of the first compressible member 830 (e.g., to maintain the contact pin 800 within a corresponding housing).

The second deformable conductor 824 may electrically couple to a contact pad of a testing apparatus, while the second compressible member 822 provides structural support for the second deformable conductor 824. For some embodiments, the second deformable conductor 824 may be an elastomeric connector (e.g., as described above with respect to FIGS. 6 and 7). For example, the second deformable conductor 824 may deform or stretch when brought into contact with the contact pad of a testing apparatus. This may ensure that the contact pin 800 establishes a secure (electrical) connection with the testing apparatus. For some embodiments, the second compressible member 822 may correspond to a spring or spring-like structure that provides additional compression strength (e.g., tension) to the second compressible member 824. For example, the second compressible member 822 may maintain a separation distance between the testing apparatus and the conductive plate 826, when the testing apparatus is in contact with the second deformable conductor 824, by opposing the compression force caused by the testing apparatus.

Figure 9:
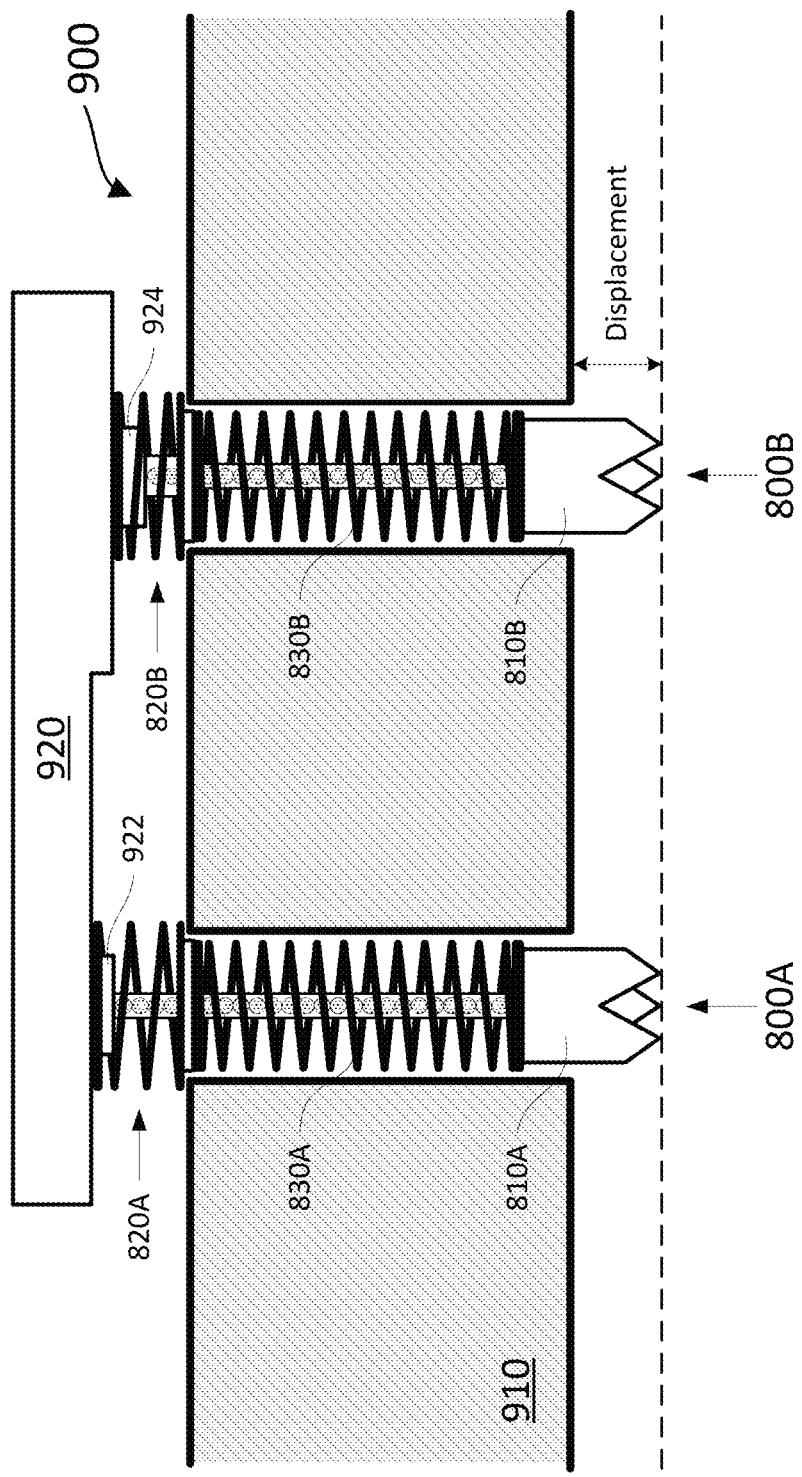
FIG. 9 illustrates yet another embodiment of a compressible contact pin assembly; and Like reference numerals refer to corresponding parts throughout the drawing figures.

The design of the second contact element 820 is particularly well-suited for applications involving an uneven distribution of compression forces across a number of contact pads. For example, FIG. 9 illustrates yet another embodiment of a compressible contact pin assembly 900. The contact pin assembly 900 includes a pair of contact pins 800A and 800B disposed within a housing assembly 910. Each of the contact pins 800A and 800B may be an identical copy of contact pin 800, described above with respect to FIG. 8. The housing 910 holds the contact pins 800A and 800B in place when interfacing with a testing apparatus. For example, the top surface of the housing 910 may have an opening that is not wide enough for the second contact elements 820A and 820B of the contact pins 800A and 800B, respectively, to fit through. The housing 910 provides structural support for the contact pins 800A and 800B by guiding the movement or displacement of the first contact elements 810A and 8108, respectively.

FIG. 9 further depicts a testing apparatus 920 that is in contact with the second contact elements 820A and 820B of the respective contact pins 800A and 800B. As shown, the testing apparatus 920 has an uneven thickness (e.g., the right side of the testing apparatus 920 is thicker than the left side). The testing apparatus 920 also includes two contact pads 922 and 924 of unequal thickness (e.g., contact pad 924 protrudes further than contact pad 922). As a result, the right side of the testing apparatus 920 may exert a much greater downward force on contact element 820B than the left side of the testing apparatus 920 exerts on contact element 820A. However, because both contact elements 820A and 820B are compressible, the corresponding contact pins 800A and 800B may be "pre-loaded" against the testing apparatus 920. This allows both contact pins 800A and 800B to establish a secure connection with their respective contact pads 922 and 924, while maintaining substantially the same displacement through the other side of the housing. In other words, the forces exerted by the testing apparatus 920 have little or no bearing on the tension in the compressible members 830A and 830B (e.g., when the first contact elements 810A and 810B are brought into contact with corresponding contact bumps of an IC device). This may ensure that the first contact elements 810A and 810B are also able to establish a secure connection with respective contact bumps of an IC device.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A contact pin, comprising:
   a first contact element;
   a second contact element;
   a first compressible member coupled between the first contact element and the second contact element to compress when one or more external forces are applied between the first contact element and the second contact element, and to maintain a separation distance between the first and second contact elements when no external forces are applied; and
   a first elastomeric connector coupled between the first contact element and the second contact element, wherein the first elastomeric connector includes:
   an elastic shield which deforms when one or more external forces are applied between the first contact element and the second contact element; and a plurality of conductive particles, disposed within the elastic shield, to form an electrical connection between the first contact element and the second contact element;
wherein the plurality of conductive particles compress with one another when the contact pin is compressed.

2. The contact pin of claim 1, wherein the first elastomeric connector enables the first contact element to remain frictionlessly coupled to the second contact element as the one or more external forces are applied between the first contact element and the second contact element.

3. The contact pin of claim 1, wherein the plurality of conductive particles are arranged in one or more columns within the elastic shield.

4. The contact pin of claim 1, wherein the first compressible member comprises a spring.

5. The contact pin of claim 1, wherein the impedance of the first compressible member is greater than the impedance of the first elastomeric connector.

6. The contact pin of claim 1, wherein the first elastomeric connector is held between the first and second contact elements by forces exerted on the first and second contact elements.

7. The contact pin of claim 6, wherein the forces exerted on the first and second contact elements are provided, at least in part, by tension in the first compressible member.

8. The contact pin of claim 1, wherein a base of at least one of the first or second contact elements includes an extended lip to hold the contact pin within a housing.

9. The contact pin of claim 8, wherein a diameter of the base of the at least one of the first or second contact elements is wider than a diameter of the first compressible member.

* * * * *